US009231192B2

(12) United States Patent
Ikeno et al.

(10) Patent No.: US 9,231,192 B2
(45) Date of Patent: *Jan. 5, 2016

(54) SEMICONDUCTOR MEMORY DEVICE AND METHOD FOR MANUFACTURING THE SAME

(71) Applicant: KABUSHIKI KAISHA TOSHIBA, Tokyo (JP)

(72) Inventors: Daisuke Ikeno, Yokohama (JP); Koji Yamakawa, Tokyo (JP); Katsuaki Natori, Yokohama (JP); Yasuyuki Sonoda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

This patent is subject to a terminal disclaimer.

(21) Appl. No.: 14/147,903

(22) Filed: Jan. 6, 2014

(65) Prior Publication Data

US 2014/0117478 A1  May 1, 2014

Related U.S. Application Data

(63) Continuation of application No. 13/407,630, filed on Feb. 28, 2012, now Pat. No. 8,653,614.

(30) Foreign Application Priority Data

Feb. 28, 2011 (JP) .................................. 2011-042685

(51) Int. Cl.
*H01L 21/76* (2006.01)
*H01L 43/02* (2006.01)
(Continued)

(52) U.S. Cl.
CPC .............. *H01L 43/02* (2013.01); *G11C 11/161* (2013.01); *H01L 27/226* (2013.01); *H01L 43/08* (2013.01)

(58) Field of Classification Search
CPC .............................. H01L 43/02; H01L 27/222
USPC .......... 257/421, E43.006, E29.323; 438/3, 99
See application file for complete search history.

(56) References Cited

U.S. PATENT DOCUMENTS 6,816,347 B2  11/2004  Koi et al.
7,663,197 B2   2/2010  Nagase et al.
(Continued)

FOREIGN PATENT DOCUMENTS

JP  2002-124716 A   4/2002
JP  2008-109118      5/2008
(Continued)

OTHER PUBLICATIONS

Japanese Office Action dated Oct. 14, 2014 for JP Application No. 2011-148445 filed Jul. 4, 2011.

(Continued)

*Primary Examiner* — Theresa T Doan
(74) *Attorney, Agent, or Firm* — Knobbe, Martens, Olson & Bear, LLP

(57) ABSTRACT

According to one embodiment, a memory device with magnetoresistive effect element is disclosed. The element includes first metal magnetic film (MMF) with nonmagnetic element and axis of easy magnetization perpendicular (EMP), first insulating film, first intermediate magnetic film between the first MMF and the first insulating film, second MMF on the first insulating film and including nonmagnetic elements, the second MMF having axis of EMP, second intermediate magnetic film between the first insulating film and the second MMF, and diffusion preventing film including metal nitride having barrier property against diffusion of the nonmagnetic elements between the first MMF and the first intermediate magnetic film.

12 Claims, 10 Drawing Sheets

(51) Int. Cl.
*G11C 11/16* (2006.01)
*H01L 43/08* (2006.01)
*H01L 27/22* (2006.01)

(56) References Cited

U.S. PATENT DOCUMENTS

| | | | |
|---|---|---|---|
| 7,768,824 B2 | 8/2010 | Yoshikawa et al. | |
| 7,924,607 B2 | 4/2011 | Yoshikawa et al. | |
| 8,036,025 B2 | 10/2011 | Nagase et al. | |
| 8,098,514 B2 | 1/2012 | Nagase et al. | |
| 8,299,522 B2 | 10/2012 | Iwamuro | |
| 8,305,801 B2 | 11/2012 | Daibou et al. | |
| 8,653,614 B2 * | 2/2014 | Ikeno et al. | 257/421 |
| 8,659,103 B2 | 2/2014 | Watanabe et al. | |
| 8,670,268 B2 | 3/2014 | Nagase et al. | |
| 8,946,837 B2 | 2/2015 | Watanabe et al. | |
| 8,953,369 B2 | 2/2015 | Nagase et al. | |
| 2002/0044479 A1 | 4/2002 | Ikeda | |
| 2004/0100855 A1 | 5/2004 | Saito et al. | |
| 2006/0114714 A1 * | 6/2006 | Kanegae | 365/158 |
| 2007/0206333 A1 | 9/2007 | Watanabe et al. | |
| 2008/0231998 A1 | 9/2008 | Yoshikawa et al. | |
| 2008/0253174 A1 | 10/2008 | Yoshikawa et al. | |
| 2009/0080238 A1 | 3/2009 | Yoshikawa et al. | |
| 2009/0080239 A1 | 3/2009 | Nagase et al. | |
| 2009/0141410 A1 * | 6/2009 | Jogo et al. | 360/324.2 |
| 2010/0096716 A1 | 4/2010 | Ranjan et al. | |
| 2010/0230770 A1 | 9/2010 | Yoshikawa et al. | |
| 2011/0007560 A1 | 1/2011 | Dieny et al. | |
| 2011/0073970 A1 | 3/2011 | Kai | |
| 2011/0116305 A1 | 5/2011 | Nagamine et al. | |
| 2011/0211389 A1 | 9/2011 | Yoshikawa et al. | |
| 2011/0222335 A1 | 9/2011 | Yoshikawa et al. | |
| 2012/0008381 A1 | 1/2012 | Nagase et al. | |
| 2012/0068284 A1 | 3/2012 | Kitagawa et al. | |
| 2012/0068285 A1 | 3/2012 | Kitagawa et al. | |
| 2012/0069640 A1 | 3/2012 | Nagase et al. | |
| 2012/0088125 A1 | 4/2012 | Nishiyama et al. | |
| 2012/0099369 A1 | 4/2012 | Kai et al. | |
| 2012/0112297 A1 | 5/2012 | Yamakawa et al. | |
| 2012/0217476 A1 | 8/2012 | Ikeno et al. | |
| 2012/0241881 A1 | 9/2012 | Daibou et al. | |
| 2012/0243305 A1 | 9/2012 | Nakayama et al. | |
| 2012/0294079 A1 | 11/2012 | Ohmori et al. | |
| 2013/0001713 A1 | 1/2013 | Ueda et al. | |
| 2013/0001714 A1 | 1/2013 | Nishiyama et al. | |
| 2013/0009259 A1 | 1/2013 | Watanabe et al. | |
| 2013/0010532 A1 | 1/2013 | Nagase et al. | |
| 2014/0124884 A1 | 5/2014 | Watanabe et al. | |
| 2014/0131823 A1 | 5/2014 | Nagase et al. | |
| 2015/0084142 A1 | 3/2015 | Nagase et al. | |
| 2015/0171317 A1 | 6/2015 | Watanabe et al. | |

FOREIGN PATENT DOCUMENTS

| | | |
|---|---|---|
| JP | 2008-252018 A | 10/2008 |
| JP | 2009-081216 A | 4/2009 |
| JP | 2009-081315 | 4/2009 |
| JP | 2009-239052 | 10/2009 |
| JP | 2010-010720 | 1/2010 |
| JP | 2010-016408 | 1/2010 |
| JP | 2010-232499 A | 10/2010 |
| JP | 2011-071352 | 4/2011 |
| JP | 2012-243933 | 12/2012 |
| WO | WO 2010/137679 | 12/2010 |
| WO | WO 2011/036795 | 3/2011 |

OTHER PUBLICATIONS

Japanese Office Action dated Oct. 14, 2014 for JP Application No. 2011-148444 filed Jul. 4, 2011.
U.S. Appl. No. 13/049,806, filed Mar. 16, 2011, Yamakawa.
U.S. Appl. No. 13/233,906, filed Sep. 15, 2011, Toshihiko Nagase.
U.S. Appl. No. 13/407,630, filed Feb. 28, 2012, Ikeno et al.
U.S. Appl. No. 13/432,626, filed Mar. 28, 2012, Masahiko Nakayama.
Background Art Information (Concise Explanation for JP 2009-81216), Toshiba Jan. 19, 2011.
Background Art Information, Toshiba, Dec. 8, 2011.
Worledge D.C., et al., "Spin torque switching of perpendicular Ta|CoFeB|MgO-based magnetic tunnel junctions", Applied Physics Letters 98, 022501 (2011).
Ikeda et al., "A perpedicular-anisotrophy CoFeB-MgO magnetic tunnel junction", Nature Materials, 2804 pp. 1-3 Jul. 11, 2010.

* cited by examiner

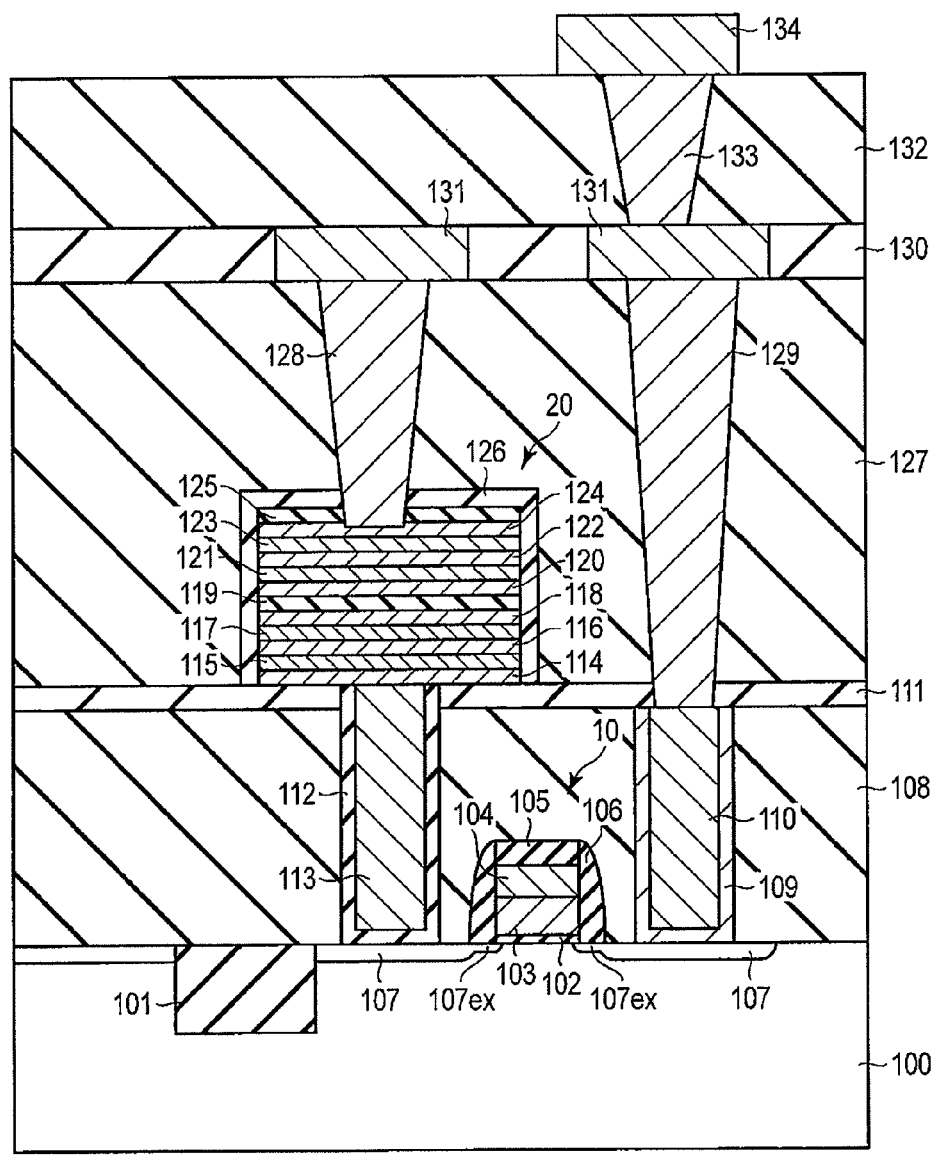
F I G. 1

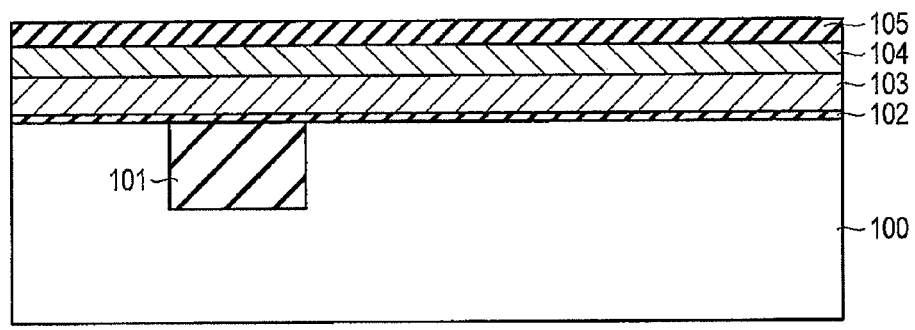
F I G. 2
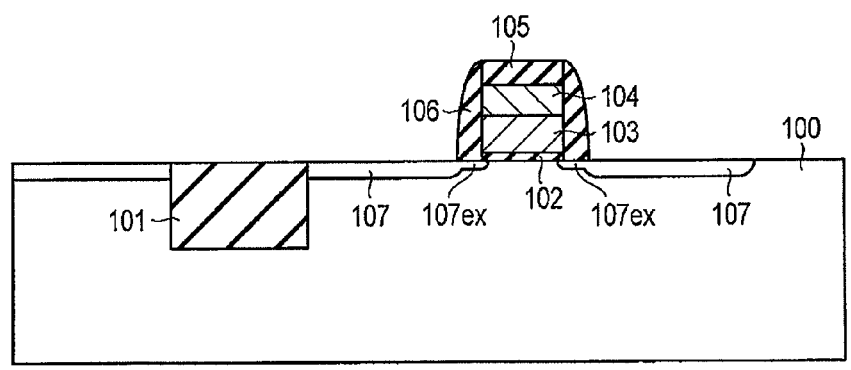
F I G. 3

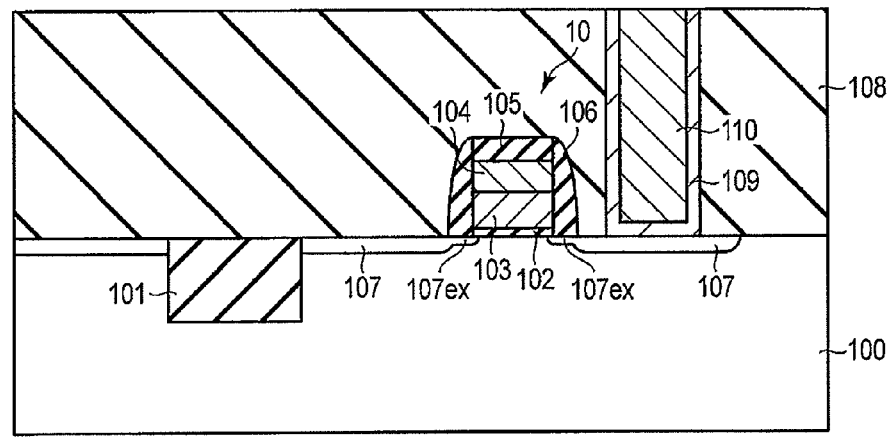
F I G. 4
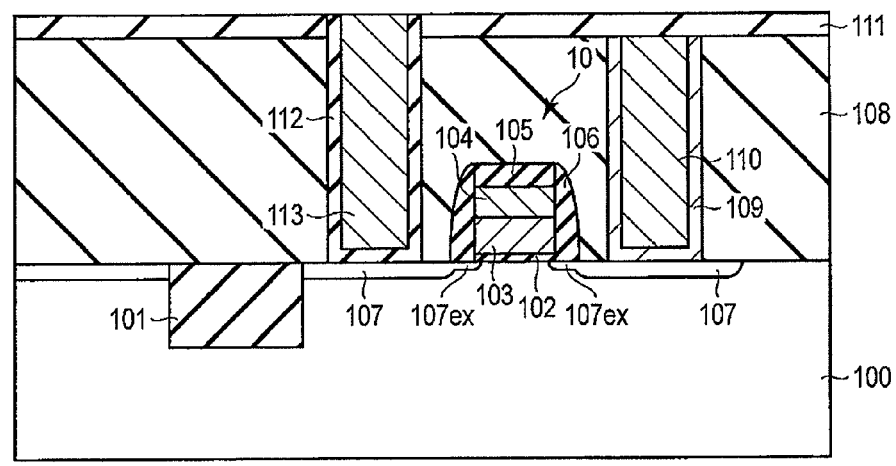
F I G. 5

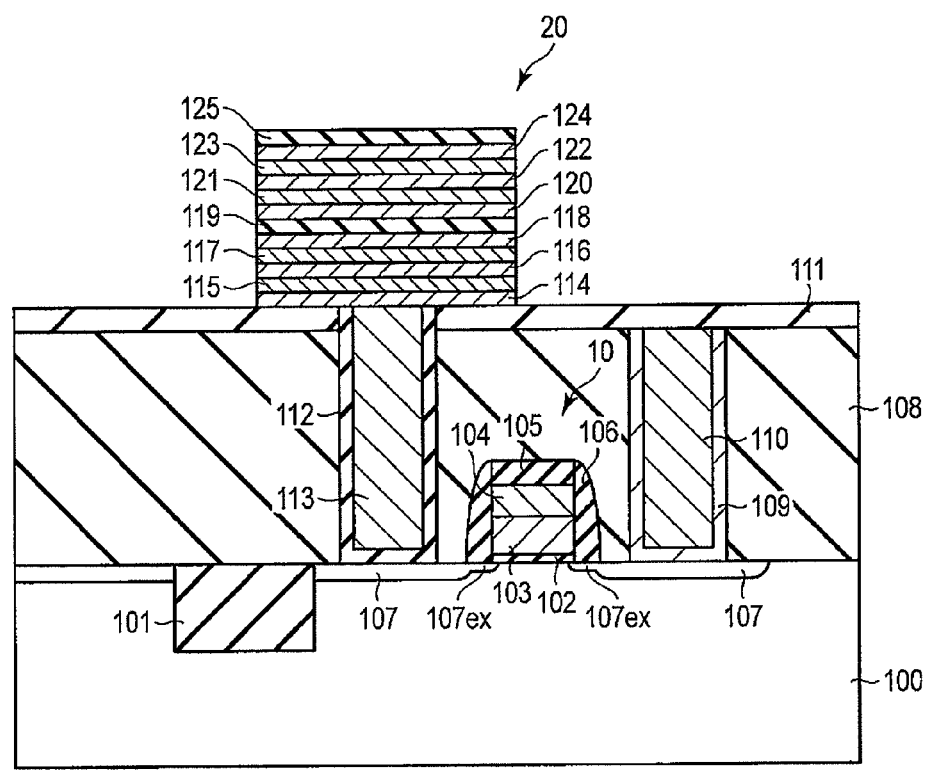
F I G. 8

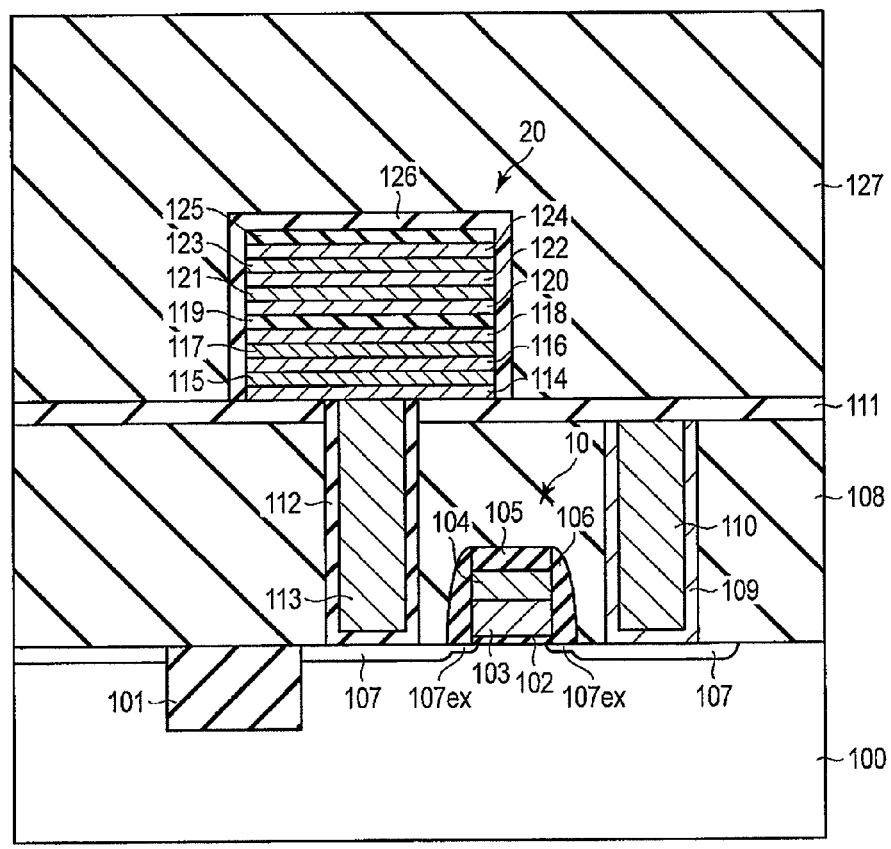
F I G. 9

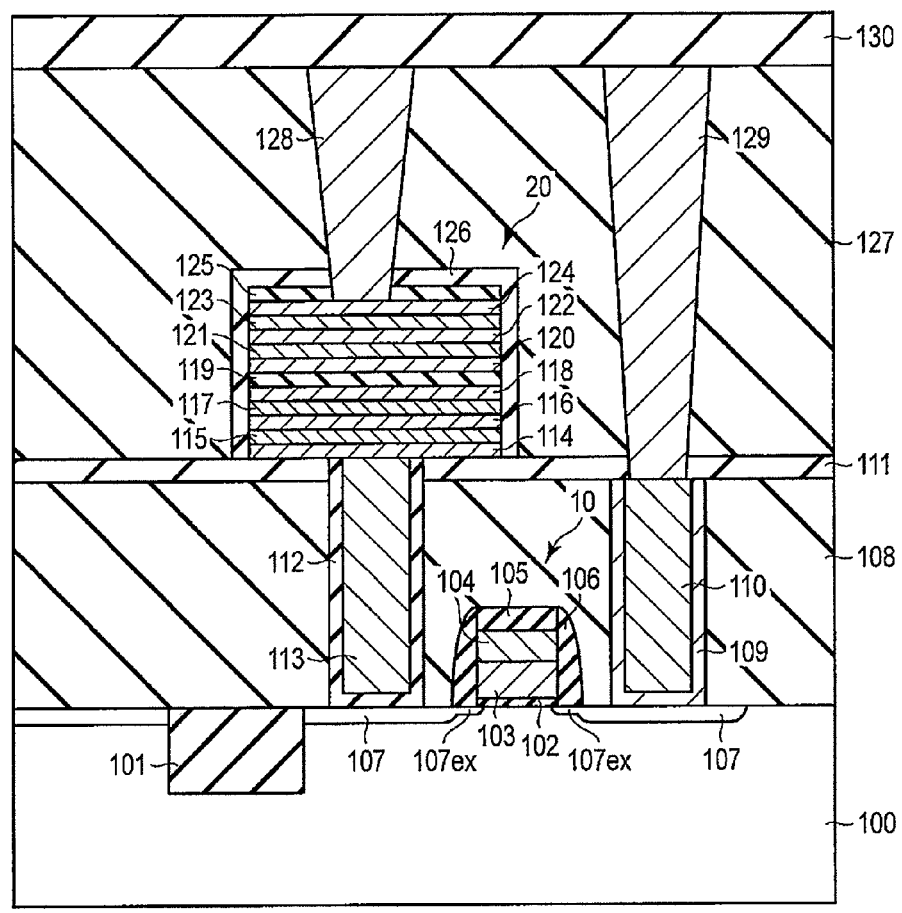
F I G. 10

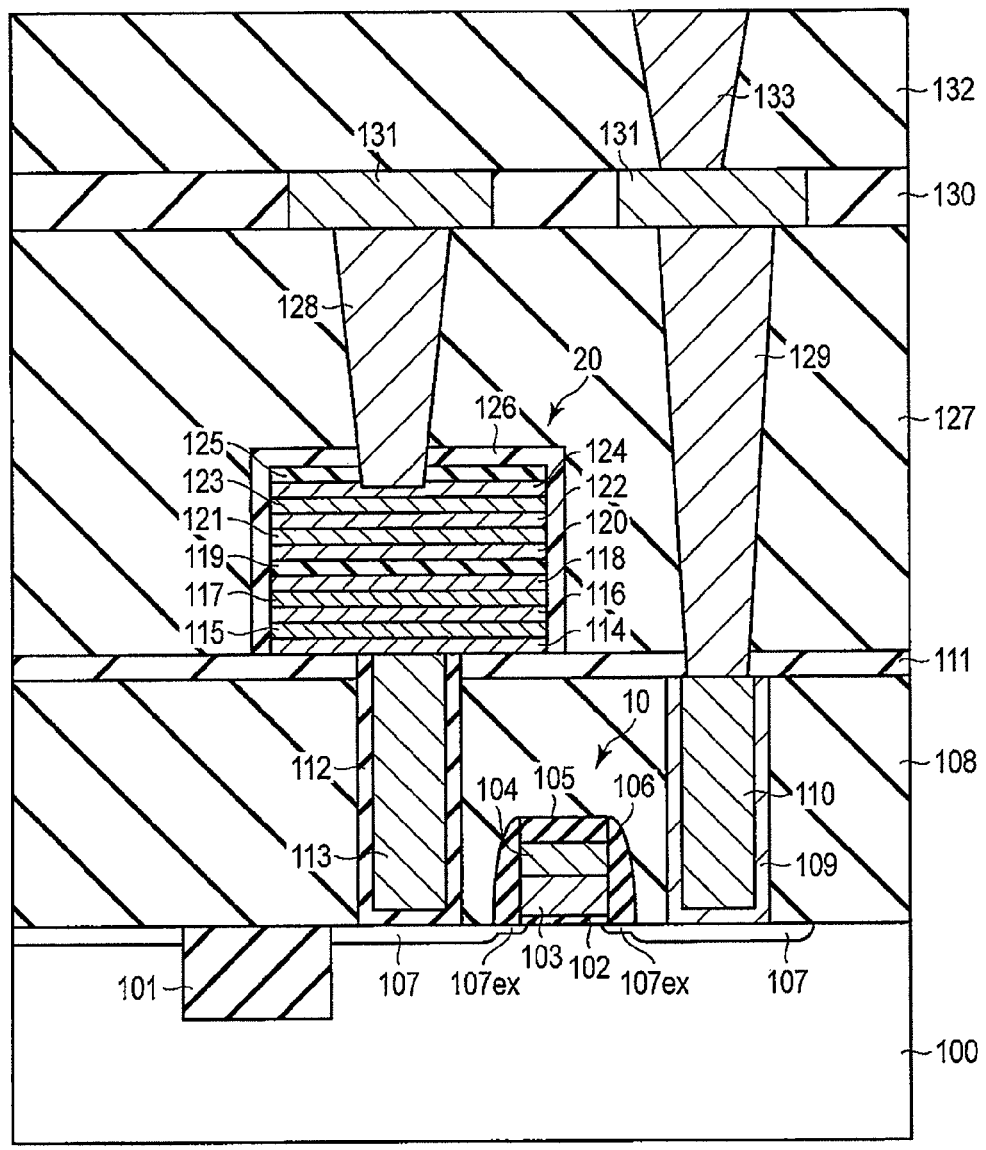
F I G. 11

SEMICONDUCTOR MEMORY DEVICE AND METHOD FOR MANUFACTURING THE SAME

CROSS-REFERENCE TO RELATED APPLICATIONS

This application is a continuation of U.S. patent application Ser. No. 13/407,630, filed Feb. 28, 2012, which is based upon and claims the benefit of priority from prior Japanese Patent Application No. 2011-042685, filed Feb. 28, 2011, the entire contents of each of which are incorporated herein by reference.

FIELD

Embodiments described herein relate generally to a semiconductor memory device utilizing a magnetoresistive effect and a method for manufacturing the semiconductor memory device.

BACKGROUND

In recent years, much attention has been attracted to magnetoresistive random access memories (MRAM) comprising magnetroresistive effect elements utilizing a magnetoresistive effect replacing a tunneling magneto resistive effect (TMR), as next-generation solid non-volatile memories.

One magnetoresistive effect element is a magnetic tunnel junction (MTJ) element with a three-layer stack configuration comprising a recording layer in which a magnetization direction is variable, an insulating film serving as a tunnel barrier, and a reference layer in which a predetermined magnetization direction is maintained.

The resistance of the MTJ element varies depending on the magnetization direction in the recording layer and the magnetization direction in the reference layer. The resistance of the MTJ element has a minimum when the two magnetization directions are parallel and has a maximum when the two magnetization directions are antiparallel These parallel state and antiparallel state are associated with binary information "0" and "1", respectively, to allow the information to be stored.

Write of information to the MTJ element involves a magnetic-field write scheme in which only the magnetization direction in the recording layer is inverted by a current magnetic field resulting from a current flowing through a write wire and a write (spin injection write) scheme using spin angular momentum movement in which the magnetization direction in the recording layer is inverted by passing a spin polarization current through the MTJ element itself.

According to the former scheme, reduced element size increases the coercive force of a magnetic substance forming the recording layer. This tends to increase a write current, hindering the magnetic-field write scheme from achieving both miniaturization and reduced required current.

On the other hand, according to the latter scheme (spin injection write scheme), the amount of spin polarization electrons to be injected may decrease consistently with the volume of a magnetic layer forming the recording layer. Thus, the spin injection write scheme is expected to easily achieve miniaturization and reduced required current.

Furthermore, miniaturization of the MTJ element serves to reduce magnetic anisotropic energy required to maintain the magnetization direction in the recording layer constant. This disadvantageously prevents stored information from being maintained.

Techniques to increase the magnetic anisotropic energy include one utilizing shape magnetic anisotropy by, for example, increasing the aspect ratio of the MTJ element, the film thickness of the recording layer, or the saturation magnetization of the recording layer, and one utilizing a material with high magneto crystalline anisotropy.

The former technique is generally examined in connection with an in-plane magnetization type in which the axis of easy magnetization of a ferromagnetic substance corresponds to magnetization parallel to a film surface. However, this hinders miniaturization from being achieved, and further contributes to increasing an inversion current when the above-described spin injection write scheme is used.

On the other hand, the latter technique is advantageous to miniaturization and reduced required current. However, with the in-plane magnetization type, the axis of easy magnetization in the in-plane direction is significantly distributed within the film plane, leading to reduced TMR ratio.

To solve the above-described problems, every effort has been made to examine an MTJ element comprising a perpendicular magnetization magnetic film with an axis of easy magnetization perpendicular to the film plane (perpendicular magnetization MTJ element). Compared to the in-plane magnetization MTJ element, the perpendicular magnetization MTJ element enables a reduction in the distribution of the direction of the axis of easy magnetization, allowing a decrease in TMR ratio to be restrained.

As described above, the use of the perpendicular magnetization MTJ element based on the spin injection write scheme is expected to achieve both miniaturization and reduced required current. However, the perpendicular magnetization MTJ element with the perpendicular magnetization magnetic film involves a significant decrease in TMR ratio caused by a thermal load.

BRIEF DESCRIPTION OF THE DRAWINGS

FIG. 1 is a cross-sectional view schematically illustrating a semiconductor memory device according to a first embodiment;

FIG. 2 is a cross-sectional view illustrating a method for manufacturing the semiconductor memory device according to the first embodiment;

FIG. 3 is a cross-sectional view illustrating the method for manufacturing the semiconductor memory device according to the first embodiment following FIG. 2;

FIG. 4 is a cross-sectional view illustrating the method for manufacturing the semiconductor memory device according to the first embodiment following FIG. 3;

FIG. 5 is a cross-sectional view illustrating the method for manufacturing the semiconductor memory device according to the first embodiment following FIG. 4;

FIG. 8 is a cross-sectional view illustrating the method for manufacturing the semiconductor memory device according to the first embodiment following FIG. 7;

FIG. 9 is a cross-sectional view illustrating the method for manufacturing the semiconductor memory device according to the first embodiment following FIG. 8;

FIG. 10 is a cross-sectional view illustrating the method for manufacturing the semiconductor memory device according to the first embodiment following FIG. 9;

FIG. 11 is a cross-sectional view illustrating the method for manufacturing the semiconductor memory device according to the first embodiment following FIG. 10.

DETAILED DESCRIPTION

Figure 6:
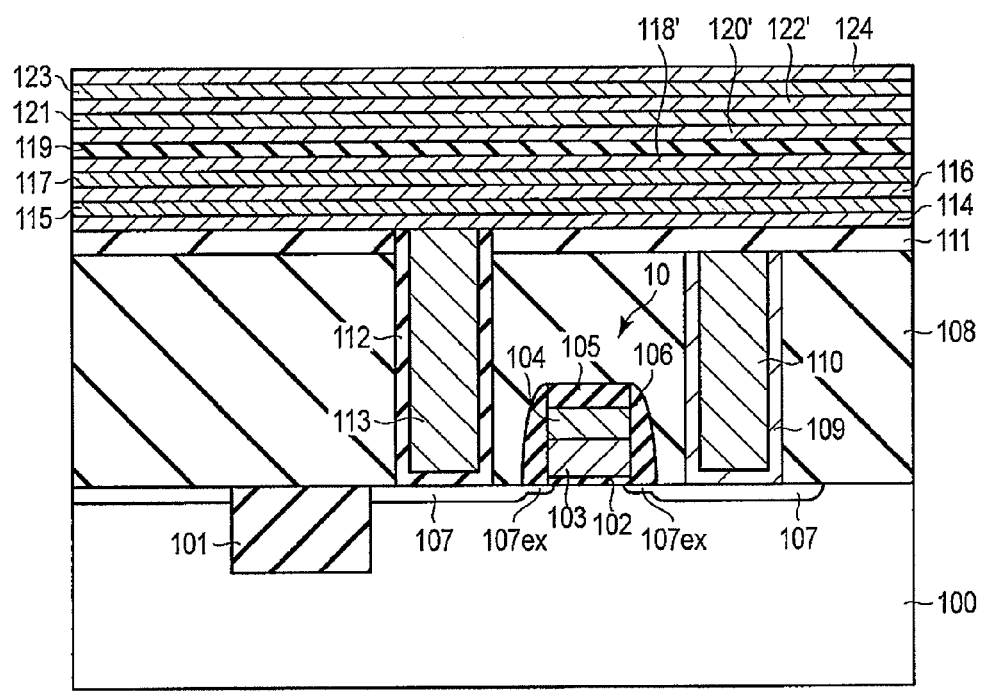
FIG. 6 is a cross-sectional view illustrating the method for manufacturing the semiconductor memory device according to the first embodiment following FIG. 5.
Figure 7:
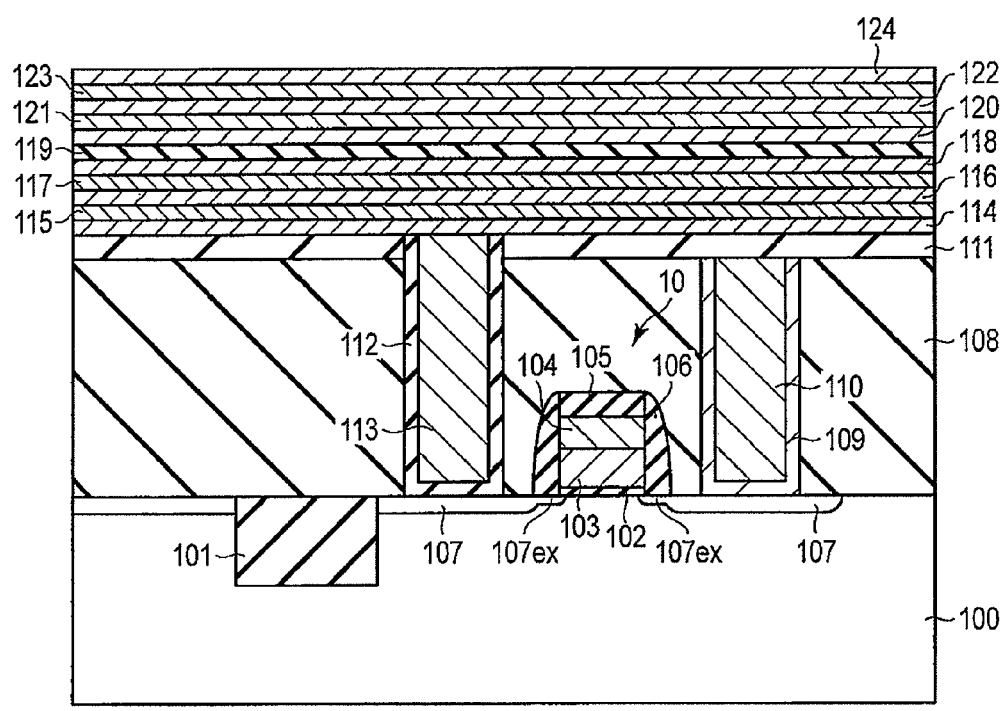
FIG. 7 is a cross-sectional view illustrating the method for manufacturing the semiconductor memory device according to the first embodiment following FIG. 6.

Embodiments will be described below with reference to the drawings.

In general, according to one embodiment, a semiconductor memory device is disclosed. The semiconductor memory device comprises a semiconductor substrate; and a magnetoresistive effect element provided on the semiconductor substrate. The magnetoresistive effect element comprises a first metal magnetic film, a first metal magnetic film, a first insulating film, a first intermediate magnetic film, a second metal magnetic film, a second intermediate magnetic film, a diffusion preventing film. The first metal magnetic film comprises nonmagnetic element and having an axis of easy magnetization perpendicular to a film plane thereof. The first insulating film is provided on the first metal magnetic film. The first intermediate magnetic film is provided between the first metal magnetic film and the first insulating film. The second metal magnetic film is provided on the first insulating film and comprises nonmagnetic element. The second metal magnetic film has an axis of easy magnetization perpendicular to a film plane thereof. The second intermediate magnetic film is provided between the first insulating film and the second metal magnetic film. The diffusion preventing film is provided at least either between the first metal magnetic film and the first intermediate magnetic film or between the second intermediate magnetic film and the second metal magnetic film. The diffusion preventing film comprises metal nitride or metal carbide having a barrier property against diffusion of the nonmagnetic element.

According to another embodiment, a method for manufacturing a semiconductor memory device is disclosed. The method comprises forming a first metal magnetic film comprising nonmagnetic element and having an axis of easy magnetization perpendicular to a film plane thereof; forming an amorphous first intermediate magnetic film on the first metal magnetic film; forming an amorphous first insulating film on the first intermediate magnetic film. The method further comprises forming an amorphous second intermediate magnetic film on the first insulating film; forming a second metal magnetic film on the second intermediate magnetic film. The method further comprises forming a diffusion preventing film comprising metal nitride or metal carbide having a barrier property against diffusion of the nonmagnetic element and being formed at least either between the first metal magnetic film and the first intermediate magnetic film or between the second intermediate magnetic film and the second metal magnetic film; and crystallizing the first intermediate magnetic film, the first insulating film, and the second intermediate magnetic film by thermal treatment.

(First Embodiment)

FIG. 1 is a cross-sectional view schematically showing a semiconductor memory device according to a first embodiment.

In FIG. 1, referential number 100 indicates P-type silicon substrate (semiconductor substrate), and an isolation area 101 is formed on a surface (active area) of the silicon substrate 100 in which the surface is isolated by the isolation area 101. The select transistor 10 is an element configured to select an MTJ element 20.

The MTJ element 20 includes a crystalline perpendicular magnetization magnetic film (first metal magnetic film) 116, a crystalline tunnel barrier film (first insulating film) 119 provided on the perpendicular magnetization magnetic film 116, an interface magnetic film (first intermediate magnetic film) 118 provided between the perpendicular magnetization magnetic film 116 and the tunnel barrier film 119 and formed in contact with the tunnel barrier film 119, a crystalline perpendicular magnetization magnetic film (second metal magnetic film) 123 provided on the tunnel barrier film 119, and an interface magnetic film (second intermediate magnetic film) 120 provided between the tunnel barrier film 119 and the perpendicular magnetization magnetic film 123 and formed in contact with the tunnel barrier film 119.

Here, the perpendicular magnetization magnetic film 116 contains nonmagnetic element and has an axis of easy magnetization perpendicular to the film plane of the perpendicular magnetization magnetic film 116. The perpendicular magnetization magnetic film 123 contains nonmagnetic element and has an axis of easy magnetization perpendicular to the film plane of the perpendicular magnetization magnetic film 123.

The MTJ element 20 further includes a diffusion preventing film 117 provided between the perpendicular magnetization magnetic film 116 and the interface magnetic film 118 and having a barrier property against diffusion of the nonmagnetic element in the perpendicular magnetization magnetic film 116, and a diffusion preventing film 121 provided between the interface magnetic film 120 and the perpendicular magnetization magnetic film 123 and having a barrier property against diffusion of the nonmagnetic element in the perpendicular magnetization magnetic film 123.

Interlayer insulating films 127 and 132 are provided on the MTJ element 20. A first upper wire 131 is formed on the interlayer insulating film 127. A second upper wire 134 is formed on the interlayer insulating film 132. Upper wiring layers above the second upper wire 134 are omitted and are not shown in the drawings.

The semiconductor memory device according to the present embodiment will be further described in accordance with steps of manufacturing the semiconductor memory device according to the present embodiment.

FIG. 2 to FIG. 11 are cross-sectional views illustrating a method for manufacturing the semiconductor memory device according to the present embodiment.

[FIG. 2]

An isolation area 101 with an STI (Shallow Trench Isolation) structure is formed by well-known method. The isolation area 101 comprises an insulating film filled in a trench formed on the surface of the P-type silicon substrate 100.

A gate oxide film 102 is formed on the surface of the P-type silicon substrate 100 by thermal oxidation. An N-type polycrystalline silicon film 103 to be a gate electrode is formed on the gate oxide film 102. A conductive film 104 of a WSix film (tungsten silicide film) or a W film (tungsten film) to be a gate electrode is formed on the N-type polycrystalline silicon film 103. A silicon nitride film 105 is formed on the conductive film 104.

[FIG. 3]

The silicon nitride film 105, the conductive film 104, the N-type polycrystalline Si film 103, and the gate oxide film 102 are shaped into a gate by RIE (Reactive Ion etching) process. When the conductive film 104 is a tungsten silicide film, the gate electrodes 103 and 104 with a polycide gate structure are obtained. When the conductive film 104 is a tungsten film, the gate electrodes 103 and 104 with a polymetal gate structure are obtained.

Impurity region containing P or As and to be source/drain regions (extensions) 107ex are formed on the surface of the P-type silicon substrate 100 by ion implantation process using the silicon nitride film 105 as a mask.

The silicon nitride film is deposited all over the resulting exposed surface and then etched by the RIE process. Thus, a sidewall spacer 106 comprising the silicon nitride film is formed on sidewalls of the gate portions 102, 103, 104, and 105.

Impurity regions containing P or As and to be source/drain regions 107ex are formed on the surface of the P-type silicon substrate 100 by ion implantation process using the silicon nitride film 105 and sidewall spacer 106 as a mask.

Thermal treatment is carried out to activate P or As in the impurity regions to form the source/drain regions 107 and 107ex including the extensions.

[FIG. 4]

A silicon oxide film to be an interlayer insulating film 108 is deposited all over the resulting exposed surface by CVD process. The silicon oxide film is then planarized by CMP (Chemical Mechanical Ppolishing) process to form the interlayer insulating film 108 with a flat surface.

A contact hole is formed in the interlayer insulating film 108 so as to communicate with one of the source/drain regions. A thin Ti film (titanium film) covering a bottom surface and a side surface of the contact hole is formed by sputter method or the CVD method, and the titanium film is subsequently changed into a TiN film (titanium nitride film) 109 by treatment in forming gas.

A tungsten film to be a contact plug 110 is deposited all over the resulting exposed surface by the CVD process, and then the tungsten film outside the contact hole is removed by CMP process (damascene process) to form the contact plug 110 in the contact hole.

[FIG. 5]

A silicon nitride film 111 is deposited all over the resulting exposed surface by CVD process. Thereafter, a contact hole is formed in the silicon nitride film 111 and in the interlayer insulating film 108 so as to communicate with the other of the source/drain regions 107. A titanium nitride film 112 and a contact plug 113 are formed in the contact hole by process similar to that for the titanium nitride film 109 and the contact plug 110.

[FIG. 6]

Next, the method proceeds to a process for forming an MTJ element. Various films forming the MTJ element are basically deposited by sputter method.

First, a Ta film (tantalum film) 114 to be a lower electrode of the MTJ element is formed all over the resulting exposed surface (the exposed surfaces of the silicon nitride film 111, the titanium nitride film 112, and the contact plug 113). The tantalum film 114 has a thickness of, for example, 5.0 nm. An orientation control film 115 is formed on the tantalum film 114. In the present embodiment, a Pt film (platinum film) is used as the orientation control film 115. The platinum film has a thickness of, for example, 5.0 nm.

Next, a perpendicular magnetization magnetic film 116 to be a reference layer is formed on the orientation control film 115. The perpendicular magnetization magnetic film 116 is, for example, an alloy film of FePt, FePd, CoPt, CoPd, or CoFePt, or a Co/Pt superlattice with a Co film and a Pt film alternately stacked or a Co/Pd superlattice with a Co film and a Pd film alternately stacked. In these superlattices, stacking period can be varied between 1 and 20 depending on the characteristics of the superlattices. The nonmagnetic elements contained in the perpendicular magnetization magnetic film 116 may be other then Pt and Pd and may be, for example, Ru, Rh, or Ir.

A diffusion preventing film 117 is formed on the perpendicular magnetization magnetic film 116 to prevent magnetic elements in the perpendicular magnetization magnetic film 116 from diffusing. The diffusion preventing film 117 is, for example, a TaNx film (tantalum nitride film). The diffusion preventing film 117 has a thickness of, for example, 0.5 nm.

A reference layer-side interface magnetic film 118' is formed on the diffusion preventing film 117. In the present embodiment, a Co40Fe40B20 film (the numbers denote composition ratios in units of at %) is used as the interface magnetic film 108'. The Co40Fe40B20 film has a thickness of, about 1.0 nm. A CoFeB film with a different composition ratio may also be used.

A tunnel barrier film 119 is formed on the interface magnetic film 118'. In the present embodiment, an MgO film is used as the tunnel barrier film 119. The tunnel barrier film 119 has a thickness of, for example, 1.5 nm.

A recording layer-side interface magnetic film 120' is formed on the tunnel barrier film 119. In the present embodiment, a Co40Fe40B20 film is used as the interface magnetic film 120'. The Co40Fe40B20 film has a thickness of, about 1.0 nm. A CoFeB film with a different composition ratio may also be used.

A diffusion preventing film 121 is formed on the interface magnetic film 120' to prevent magnetic elements contained in a recording layer which is to be formed in a subsequent step. The diffusion preventing film 121 is, for example, a TaNx film (tantalum nitride film). The diffusion preventing film 121 has a thickness of, for example of 0.5 nm.

A recording layer-side interface magnetic film 122' is formed on the diffusion preventing film 121. In the present embodiment, a Co40Fe40B20 film is used as the interface magnetic film 122'. The Co40Fe40B20 film has a thickness of, about 0.5 nm. A CoFeB film with a different composition ratio may also be used. The interface magnetic film 122' need not necessarily be formed. The remaining steps may be carried without forming the interface magnetic film 122'.

A perpendicular magnetization magnetic film 123 to be a recording layer is formed on the interface magnetic film 122' (on the diffusion preventing film 121 when the interface magnetic film 122' is not formed). The perpendicular magnetization magnetic film 123 may be a Co/Pt superlattice with a Co film and a Pt film alternately stacked or a Co/Pd superlattice with a Co film and a Pd film alternately stacked. In these superlattices, stacking period can be varied between 1 and 20 depending on the characteristics of the superlattices. Furthermore, the nonmagnetic elements contained in the perpendicular magnetization magnetic film 123 may be other then Pt and Pd and may be, for example, Ru, Rh, or Ir.

A Ta film (tantalum film) 124 to be an upper electrode of the MTJ element is formed on the perpendicular magnetization magnetic film 123. The tantalum film 124 has a thickness of, for example, 10 nm.

[FIG. 7]

The MgO film serving as the tunnel barrier film 119 is crystallized by annealing in a vacuum. The annealing (crystallization annealing) crystallizes the MgO film and simultaneously crystallizes the Co40Fe40B20 films serving as the interface magnetic films 118', 120', and 122'. B is separated from the Co40Fe40B20 films, resulting in the interface magnetic films 118, 120, and 122 formed of Co50Fe50 films.

The present inventors have found out that with a conventional structure lacking the diffusion preventing films 117 and 121, during annealing for crystallizing the MgO film serving as the tunnel barrier film 119, the nonmagnetic elements in the perpendicular magnetization magnetic films 116 and 123 diffuse into the tunnel barrier film 119 and the vicinity thereof (for example, the interface magnetic films 118 and 120), resulting in reduced TMR ratio.

In contrast, in the present embodiment, the diffusion preventing films 117 and 121 enable the nonmagnetic elements in the perpendicular magnetization magnetic films 116 and 123 to be effectively prevented from diffusing into the tunnel barrier film 119 and the vicinity thereof.

Thus, the present embodiment can exert an effect that otherwise needs to be produced by crystallizing the MgO film, that is, an extremely high TMR ratio.

In the present embodiment, the diffusion preventing film is provided both on the reference layer side and on the recording layer side but may be provided exclusively on one of these sides. Even in this case, the adverse effect of a thermal load (diffusion of the nonmagnetic elements) involved in the crystallization annealing of the MgO film can be reduced. Therefore, the present embodiment can achieve a higher TMR ratio than the conventional art.

[FIG. 8]

A silicon oxide film to be a hard mask 125 is formed on the tantalum film 124 by CVD process. The silicon oxide film is then etched using a resist pattern (not shown in the drawings) as a mask to form the hard mask 125.

The stack films 124 to 114 are processed into predetermined shapes by RIE process using the hard mask 125 as a mask. The lower electrode 114, the orientation control film 115, the reference layer 116, the recording layer 123, the upper electrode 124, and the other layers are thus formed to have the predetermined shapes. As a result, the MTJ element 20 is obtained.

[FIG. 9]

A protective film 126 is formed so as to cover a top surface and side surfaces of the MTJ element 20. In the present embodiment, a silicon nitride film is used as the protective film 126. The silicon nitride film is formed by, for example, CVD process.

An interlayer insulating film 127 is formed on an area including the MTJ element 20 and the protective film 126. In the present embodiment, a silicon oxide film is used as the interlayer insulating film 127. The silicon oxide film is formed by, for example, CVD process. A temperature for forming the silicon film is, for example, 400° C. to 500° C.

The present inventors have found out that when the thermal load of the above-described temperature is imposed on the MTJ element 20 with conventional structure which lacks the diffusion preventing films 117 and 121, the nonmagnetic elements in the perpendicular magnetization magnetic films 116 and 123 diffuse to the tunnel barrier film 119 and the vicinity thereof (for example, the interface magnetic films 118 and 120) (external diffusion), thus resulting in reduced TMR ratio.

In contrast, in the present embodiment, the diffusion preventing films 117 and 121 enable the nonmagnetic elements in the perpendicular magnetization magnetic films 116 and 123 to be effectively prevented from diffusing into the tunnel barrier film 119 and the vicinity thereof. Hence, the above-described problems can be avoided.

Thus, the present embodiment can exert an effect that otherwise needs to be produced by crystallizing the MgO film, that is, an extremely high TMR ratio.

In the present embodiment, the diffusion preventing film is provided both on the reference layer side and on the recording layer side but may be provided exclusively on one of these sides. Even in this case, the adverse effect of a thermal load (diffusion of the nonmagnetic elements) involved in the crystallization annealing of the MgO film can be reduced. Therefore, the present embodiment can achieve a higher TMR ratio than the conventional art.

[FIG. 10]

A contact hole is formed so as to communicate with upper electrode 124, and at the same time, a contact hole is formed so as to communicate with the contact plug 110.

At this time, etching rate is varied between when the interlayer insulating film 127 (silicon oxide film) is etched and when the protective film (silicon oxide film) 126, the hard mask (silicon nitride film) 125, and the silicon nitride film 111 are etched.

That is, when the interlayer insulating film 127 (silicon oxide film) is etched, the silicon oxide film exhibits a sufficiently higher etching rate than the silicon nitride film. When the protective film (silicon oxide film) 126, the hard mask (silicon nitride film) 125, and the silicon nitride film 111 are etched, the silicon nitride film exhibits a sufficiently higher etching rate than the silicon oxide film.

Next, an aluminum film to be contact plugs 128 and 129 is formed all over the resulting exposed surface. The aluminum film outside the contact hole is removed by CMP process (damascene process) to form the contact plugs 128 and 129.

A silicon oxide film 130 is formed on the surface planarized by the damascene process (the exposed surfaces of the interlayer insulating film 127 and the contact plugs 128 and 129).

[FIG. 11]

Wiring groove communicating with the contact plugs 128 and 129 are formed in the silicon oxide film 130 by RIE process. Subsequently, first upper wiring 131 is filled in the wiring groove by deposition of wiring material (for example, aluminum) and planarization by CMP process.

An interlayer insulating film 132 is formed on the planarized surfaces (the exposed surfaces of the interlayer insulating film 132 and a first upper wire 133). The interlayer insulating film 132 is, for example, a silicon oxide film.

Also in this case, the diffusion preventing films 117 and 121 serve to prevent the nonmagnetic elements during deposition of the interlayer insulating film 132. Thus, the decrease in TMR ratio can be prevented.

A via hole is formed in the silicon oxide film 132 by RIE process, and a via plug 133 connecting to the first upper wire 131 is subsequently formed by deposition of plug material (for example, aluminum) and planarization by CMP process.

Thereafter, a second upper wiring connecting to the via plug 133 is formed by process similar to that for the first upper wire 131.

Since the semiconductor memory device according to the present embodiment comprises the diffusion preventing films 117 and 121, a decrease in TMR ratio caused by the diffusion of the nonmagnetic elements can be prevented not only during manufacturing but also during the use of the manufactured semiconductor memory device.

As described above, according to the present embodiment, the diffusion preventing film allow the tunnel barrier film and the nearby films to be prevented from being degraded by the diffusion of the nonmagnetic elements in the perpendicular magnetization magnetic film. The present embodiment can thus provide a semiconductor device utilizing a magnetoresistive effect that enables the TMR ratio to be restrained from being reduced by thermal load.

(Second Embodiment)

Figure 12:
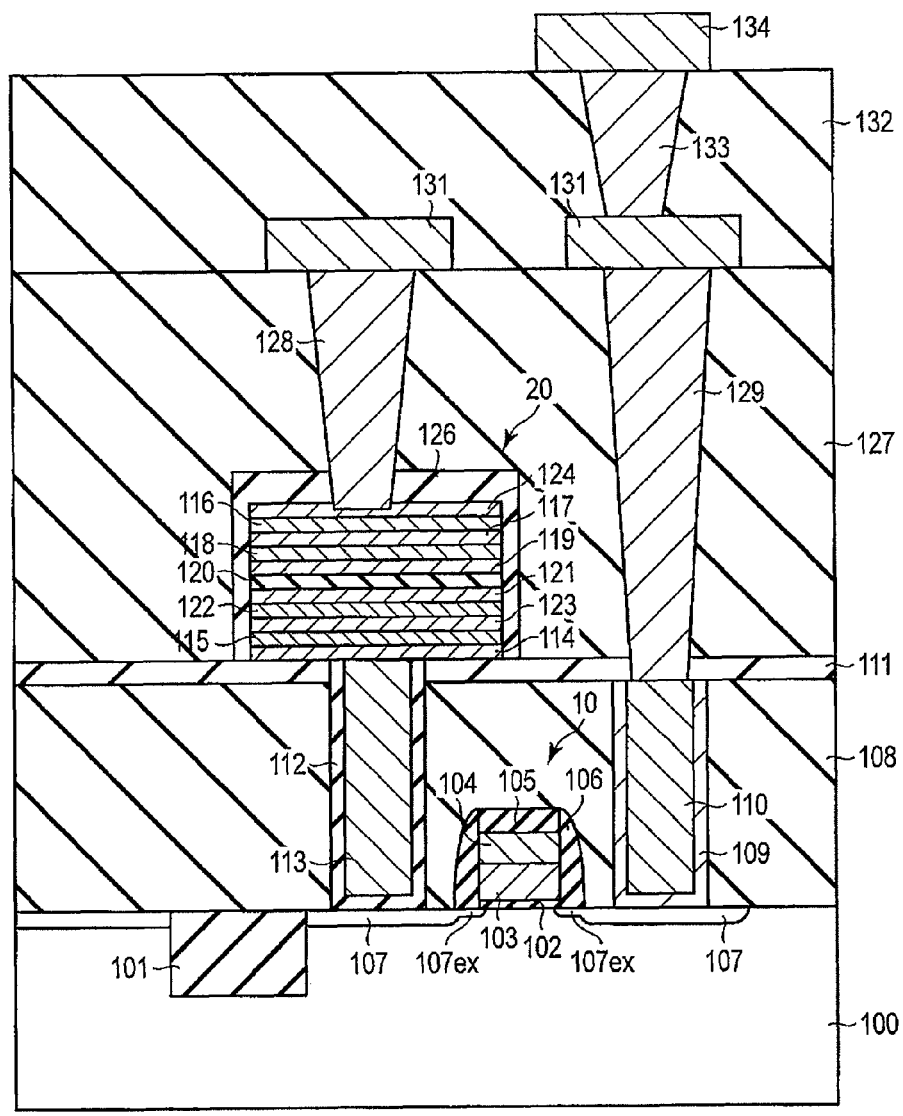
FIG. 12 is a cross-sectional view schematically showing a semiconductor memory device according to a second embodiment.

FIG. 12 is a cross-sectional view schematically showing a semiconductor memory device according to a second embodiment. In the following figures, the portions corresponding to the portions shown in the previously mentioned drawings are denoted by the same reference numerals and omitted its detail explanation.

The present embodiment is different from the first embodiment in that the reference layer and the recording layer are stacked in the reverse order. That is, in the present embodiment, the MTJ element is use in which the recording layer is located on the upper side and the reference layer is located on the lower side. The present embodiment exerts effects similar to those of the first embodiment.

The present invention is not limited to the above-described embodiments.

For example, in the above-described embodiments, the Pt film is used as the orientation control film. However, an Ir film or an Ru film may be used as the orientation control film. Alternatively, a stack film including at least two of a Pt film, an Ir film, and an Ru film may be used as the orientation control film.

Furthermore, in the above-described embodiments, the CoFeP film is used as the interface magnetic film for each of the reference layer and the recording layer. However, a CoFe film, a Co film, or an Fe film may be used as the interface magnetic film.

Additionally, in the above-described embodiments, the diffusion preventing film is formed of tantalum oxide. However, the diffusion preventing film may be formed of oxide of titanium, tungsten, molybdenum, niobium, zirconium, or hafnium. Moreover, the diffusion preventing film may be formed of, instead of the above-described oxide, carbide of titanium, tungsten, molybdenum, niobium, zirconium, or hafnium.

The nitride and carbide of the metal exhibit a more significant amorphous property than the metal under the same thermal load (in this case, for example, at about 400° C. because the MTJ process has finished). It is thus expected that the nonmagnetic elements can be effectively prevented from diffusing via the grain boundary of the diffusion preventing film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate; and
   a magnetoresistive effect element on the semiconductor substrate,
   the magnetoresistive effect element comprising:
      a first metal magnetic film;
      a first insulating film on the first metal magnetic film;
      a second metal magnetic film on the first insulating film;
      a first intermediate magnetic film between the first insulating film and the second metal magnetic film; and
      a nonmagnetic metal nitride or carbide film between the first intermediate magnetic film and the second metal magnetic film,
   wherein the second metal magnetic film comprises a nonmagnetic element, and the nonmagnetic element is Pt, or Pd, and the first metal magnetic film, the first insulating film, the first intermediate magnetic film, the nonmagnetic metal nitride or carbide film, and the second metal magnetic film are in line in this order.

2. The semiconductor memory device according to claim 1, wherein the metal nitride or carbide film comprises nitride or carbide of tantalum, titanium, tungsten, molybdenum, niobium, zirconium, or hafnium.

3. The semiconductor memory device according to claim 1, wherein each of the first and second metal magnetic films comprises a superlattice comprising the nonmagnetic element or an alloy comprising the nonmagnetic element.

4. The semiconductor memory device according to claim 1, wherein the first insulating film is a tunnel barrier film comprising magnesium oxide.

5. The semiconductor memory device according to claim 1, wherein the first intermediate magnetic film is configured to contact the first insulating film.

6. The semiconductor memory device according to claim 1, wherein the magnetoresistive effect element is a MTJ (magnetic tunnel junction) element.

7. The semiconductor memory device according to claim 1, wherein the first metal magnetic film is a recording layer, and the second metal magnetic film is a reference layer.

8. The semiconductor memory device according to claim 1, further comprising an electrode on the second metal magnetic film and a second insulating film on the electrode.

9. The semiconductor memory device according to claim 1, wherein the first metal magnetic film is a reference layer, and the second metal magnetic film is a recording layer.

10. The semiconductor memory device according to claim 1, wherein the first insulating film is a crystalline insulating film.

11. The semiconductor memory device according to claim 1, further comprising:
    a second intermediate magnetic film between the first metal magnetic film and the first insulating film.

12. The semiconductor memory device according to claim 1, wherein each of the first and second metal magnetic film has an axis of easy magnetization perpendicular to a film plane.

* * * * *